(12) United States Patent
Kim et al.

(10) Patent No.: US 7,344,904 B2
(45) Date of Patent: Mar. 18, 2008

(54) METHOD OF FABRICATING LASER DIODE

(75) Inventors: Yeon-hee Kim, Gyeonggi-do (KR);
Kwang-ki Choi, Gyeonggi-do (KR);
Youn-joon Sung, Gyeonggi-do (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 315 days.

(21) Appl. No.: 11/152,255

(22) Filed: Jun. 15, 2005

(65) Prior Publication Data
US 2006/0045155 A1 Mar. 2, 2006

(30) Foreign Application Priority Data
Aug. 31, 2004 (KR) ........................ 10-2004-0069149

(51) Int. Cl.
*H01L 33/00* (2006.01)
(52) U.S. Cl. .................... 438/31; 438/39; 257/E33.006
(58) Field of Classification Search .................. 438/38, 438/39, 748, 754, 31; 257/E33.027, E21.034
See application file for complete search history.

(56) References Cited

U.S. PATENT DOCUMENTS 5,292,675 A * 3/1994 Codama ..................... 438/163
2003/0173674 A1* 9/2003 Nakamura .................. 257/758
2004/0248334 A1* 12/2004 Hoss et al. .................... 438/39
2004/0264533 A1* 12/2004 Matsumura et al. .......... 372/45

FOREIGN PATENT DOCUMENTS

WO 00/52796 9/2000

* cited by examiner

*Primary Examiner*—Carl Whitehead, Jr.
*Assistant Examiner*—Jennifer M. Dolan
(74) *Attorney, Agent, or Firm*—Buchanan Ingersoll & Rooney PC

(57) ABSTRACT

Provided is a method of fabricating a laser diode. Embodiments of the method include sequentially forming at least a lower clad layer, a resonance layer, an upper clad layer, an upper contact layer, an upper electrode layer, and a sacrificial layer on a substrate; forming a ridge portion by etching the sacrificial layer, the upper electrode layer, the upper contact layer, and a predetermined depth of the upper clad layer; exposing both top surfaces of the upper contact layer and both bottom surfaces of the sacrificial layer corresponding thereto by etching portions of the upper electrode layer, which are exposed on both sides of the ridge portion; forming a buried layer having an opening that exposes at least a portion of the bottom surface of the sacrificial layer, the buried layer formed on the surface of the ridge portion and the top surface of the upper clad layer that extends from the ridge portion; and removing the sacrificial layer and a portion of the buried layer disposed thereon by supplying an etchant through the opening.

12 Claims, 7 Drawing Sheets

METHOD OF FABRICATING LASER DIODE

BACKGROUND

This application claims the priority of Korean Patent Application No. 10-2004-0069149, filed on Aug. 31, 2004, in the Korean Intellectual Property Office, the disclosure of which is incorporated herein in its entirety by reference.

1. Field of the Invention

The present invention relates to a method of fabricating a laser diode, and more particularly, to a method of fabricating a laser diode using self-alignment.

2. Description of the Related Art

Laser beams of a semiconductor laser diode are used in varied fields, such as optical communications, multiple communications and space communications. A semiconductor laser is widely used as a light source for data transmission and data recording or reading in many apparatuses, such as compact disk players (CDPs) and digital versatile disk players (DVDPs).

The broad application of a semiconductor laser diodes are because such diodes can maintain an oscillation characteristic in a limited space, be scaled down and, above all, provide a small threshold current for laser oscillation. As semiconductor lasers are applied in increasingly varied fields, the requisition for semiconductor laser diodes having a lower threshold current increases. That is, a semiconductor laser diode having excellent characteristics, which allows low-current oscillation and long life span, is required.

FIG. 1 is a cross-sectional view of a conventional semiconductor laser diode. The semiconductor laser diode includes a ridge wave guide structure that provides a reduced threshold current for laser oscillation.

Referring to FIG. 1, an n-GaN lower contact layer 12, which is divided into a first region R1 and a second region R2, is stacked on a sapphire substrate 10. In the first region R1, an n-GaN/AlGaN lower clad layer 24, an n-GaN lower waveguide layer 26, an InGaN active layer 28, a p-GaN upper waveguide layer 30, and a p-GaN/AlGaN upper clad layer 32 are sequentially stacked on the n-GaN lower contact layer 12. In this case, the refractive index of the n-GaN/AlGaN lower clad layer 24 and p-GaN/AlGaN upper clad layer 32 is lower than that of the n-GaN lower waveguide layer 26 and p-GaN upper waveguide layer 30. Also, the refractive index of the n-GaN lower waveguide layer 26 and p-GaN upper waveguide layer 30 is lower than that of the InGaN active layer 28. In an upper central portion of the p-GaN/AlGaN upper clad layer 32, a protruding ridge 32a having a predetermined width is formed, providing a ridge waveguide structure. A p-GaN upper contact layer 34 is formed on the top surface of the ridge 32a. On the p-GaN/AlGaN upper clad layer 32, a buried layer 36 having a contact hole is formed as a passivation layer. The contact hole 36a of the buried layer 36 corresponds to a top portion of the upper contact layer 34, and an outer portion of the contact hole 36a overlaps an outer portion of the top surface of the upper contact layer 34.

A p-type upper electrode 38 is formed on the buried layer 36 and contacts the upper contact layer 34 through the contact hole 36a of the buried layer 36. On the n-GaN lower contact layer 12, an n-type lower electrode 37 is formed in the second region R2 that is lower than the first region R1.

The ridge waveguide structure provided on the upper clad layer 32 limits a current supplied to the active layer 28, thereby reducing a width of a resonance region for laser oscillation formed in the active layer 28. Thus, the ridge waveguide structure stabilizes a transverse mode characteristic and lowers an operating current.

In a process for providing the foregoing ridge waveguide structure, a contact hole corresponding to the top surface of a ridge can be formed in a buried layer covering an adjacent region of an upper clad layer by performing photolithography using a mask. However, this photolithography results in low precision of a fabrication process and an insufficient contact area between an upper contact layer and a p-type upper electrode. Hence, the operating voltage of the laser device is elevated, and any path through which heat generated during driving is emitted cannot be secured.

For this reason, self-alignment is preferred as a method of forming a contact hole in a laser diode. WO No. 2000/52796 teaches a method of forming a self-aligned contact hole by liftoff using selective solution of materials. However, in this method, a buried layer having an excessively large thickness cannot be lifted off. Thus, the thickness of the buried layer to be lifted off should be limited below a predetermined value. In particular, because the liftoff method utilizes a difference in solubility between materials, only a restricted range of materials can be used to form the buried layer.

In another conventional method using self-alignment, an etchback process is performed such that contact hole is formed in a buried layer corresponding to the top surface of a ridge. Specifically, a planarized photoresist is formed on the entire wafer in which the buried layer is formed on the ridge. Thereafter, a portion of the photoresist, which is formed on the ridge, is etched back using dry etching so that the contact hole corresponding to the top surface of the ridge can be formed. In this technique, since there is no etch stop layer between the buried layer and the ridge, it is difficult to grasp an etch stop point during the etchback process. Also, a portion of the buried layer, which is disposed on the ridge portion and exposed by the dry etchback process, should be removed using wet etching, not dry etching, because the dry etching may damage an upper contact layer disposed as an upper portion of the ridge. However, in this case, an etchant used for the wet etching penetrates between the photoresist and the buried layer, thereby over-etching the buried layer toward the lateral surfaces of the ridge.

SUMMARY

The present invention in exemplary embodiments provides a method of fabricating a laser diode, which protects a ridge in a ridge waveguide structure so that increases in a leakage current and an operating current can be prevented. The exemplary embodiments illustrate a fabricating process that is simple, with improved precision and reliability.

According to an aspect of an embodiment of the present invention, there is provided a method of fabricating a laser diode. The method may include sequentially forming a lower clad layer, a resonance layer, an upper clad layer, an upper contact layer, an upper electrode layer, and a sacrificial layer on a substrate; forming a ridge portion by etching the sacrificial layer, the upper electrode layer, the upper contact layer, and a predetermined depth of the upper clad layer; exposing both top surfaces of the upper contact layer and both bottom surfaces of the sacrificial layer corresponding thereto by etching portions of the upper electrode layer, which are exposed on both sides of the ridge portion; forming a buried layer having an opening that exposes at least a portion of the bottom surface of the sacrificial layer, the buried layer formed on the surface of the ridge portion and the top surface of the upper clad layer that extends from the ridge portion; and removing the sacrificial layer and a portion of the buried layer disposed thereon by supplying an etchant through the opening.

The exposed upper electrode layer may be wet etched using a mixture of $H_2SO_4$ and $H_2O_2$. The sacrificial layer and the portion of the buried layer formed thereon may be removed using liftoff. The sacrificial layer may be removed using wet etching. The sacrificial layer may be selectively etched using an etchant supplied through at least one of the bottom surfaces of the exposed sacrificial layer, and the etchant may be a buffered oxide etchant (BOE) solution or an HF solution. Accordingly, the portion of the buried layer formed on the sacrificial layer may be removed together with the sacrificial layer.

The sacrificial layer may be formed of silicon oxide, for example, $SiO_2$, to a thickness of about 100 to about 10000 Å. The buried layer may be formed of an insulating material, for example, $TiO_2$, to a thickness of about 100 to about 10000 Å.

The method of fabricating a laser diode may further comprise forming a buffer layer between the substrate and the lower clad layer. The buffer layer may be an n-GaN-based III-V group nitride semiconductor layer, and the lower clad layer may be an n-GaN/AlGaN layer.

The forming of the resonance layer may comprise forming a lower waveguide layer on the lower clad layer using a material having a higher refractive index than that of the lower clad layer; forming an active layer on the lower waveguide layer using a material that enables lasing; and forming an upper waveguide layer on the active layer.

The upper and lower waveguide layers may have a lower refractive index than that of the active layer and be formed of GaN-based III-V group compound semiconductors.

The active layer may be formed of a GaN-based III-V group nitride compound semiconductor, such as $In_xAl_yGa_{1-x-y}N$ ($0 \leq x \leq 1$, $0 \leq y \leq 1$, and $x+y \leq 1$).

The upper clad layer may be formed of p-GaN/AlGaN, while the upper contact layer may be formed of a p-GaN-based III-V group nitride semiconductor.

In an embodiment of the present invention, a ridge portion including an upper clad layer, an upper contact layer, an upper electrode layer, and a sacrificial layer is formed using a one-time etching process, and a buried layer is formed on the surface of the ridge portion using a one-time deposition process. Also, since the sacrificial layer and the buried layer disposed thereon are easily removed from the ridge portion, a fabrication process is simple, and the precision and reliability thereof are enhanced.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EXEMPLARY EMBODIMENTS OF THE INVENTION

Figure 1:
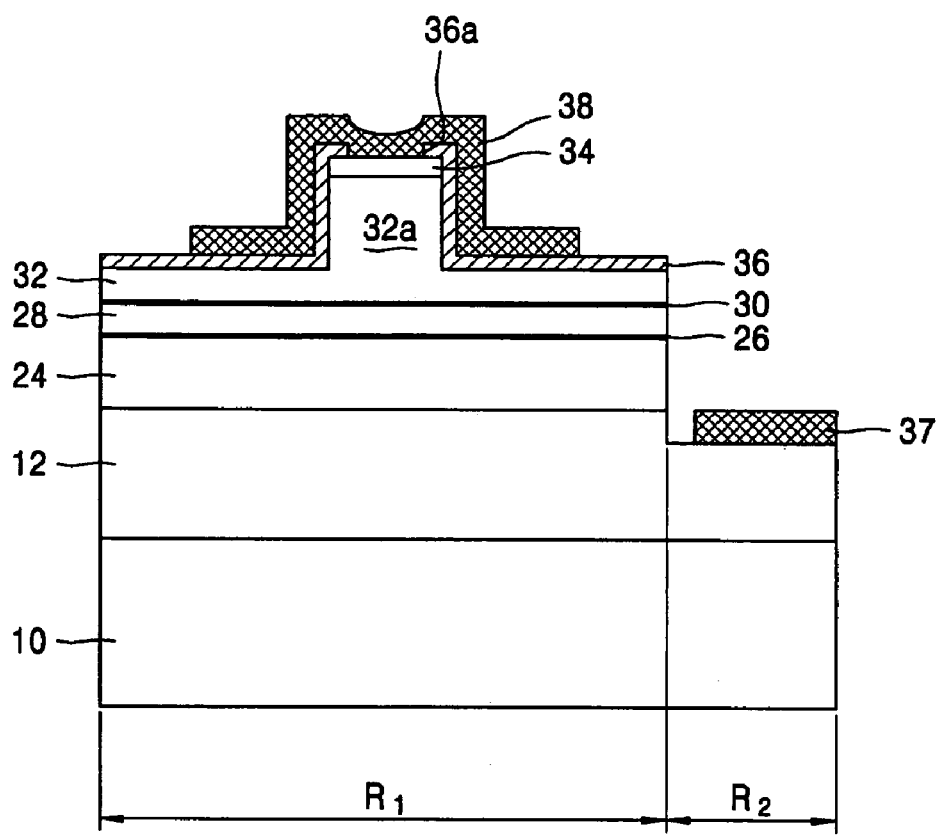
FIG. 1 is a schematic cross-sectional view of a conventional laser diode.

The present invention will now be described more fully with reference to the accompanying drawings, in which exemplary embodiments of the invention are shown. In the drawings, the thicknesses, sizes, arrangements of layers and regions are exaggerated for clarity of explanation.

Figure 2:
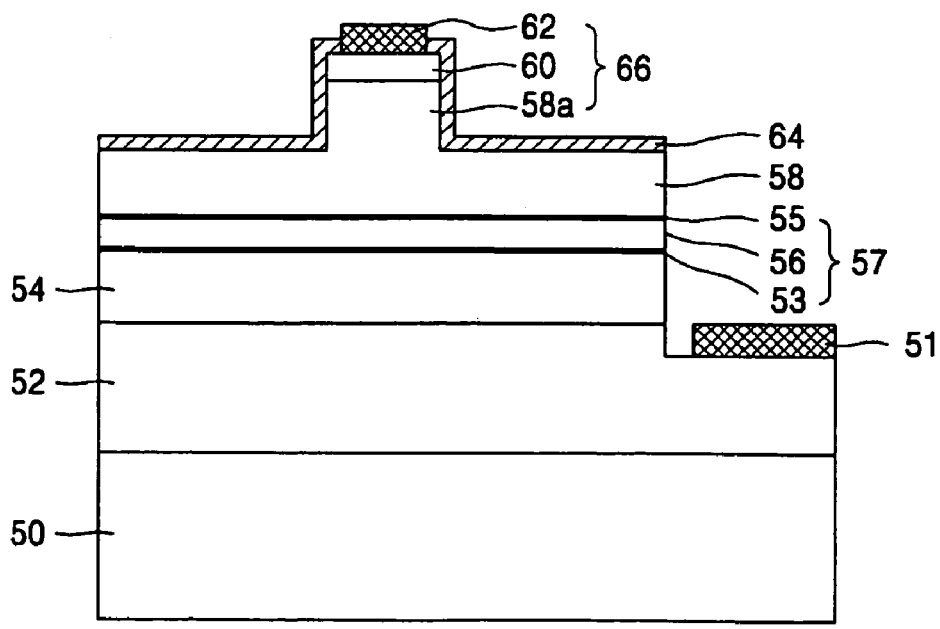
FIG. 2 is a schematic cross-sectional view of a laser diode fabricated according to an embodiment of the present invention.

FIG. 2 is a schematic cross-sectional view of a semiconductor laser diode fabricated according to an embodiment of the present invention.

Referring to FIG. 2, the semiconductor laser diode includes a substrate 50 and a buffer layer 52, a lower clad layer 54, a resonance layer 57, an upper clad layer 58, an upper contact layer 60, and an upper electrode layer 62, which are sequentially stacked on the substrate 50. Also, a protruding portion 58a of the upper clad layer 58, the upper contact layer 60, and the upper electrode layer 62 form a ridge portion 66.

The buffer layer 52 as a lower contact layer may be stacked on the top surface of the substrate 50 and may have a step difference. An n-type lower electrode 51 may be disposed on a stepped portion of the buffer layer 52.

The substrate 50 may be a sapphire substrate or a free-standing GaN substrate. The buffer layer 52 may be an n-GaN-based III-V group compound semiconductor layer, preferably, an n-GaN layer, but not limited thereto. That is, the buffer layer 52 may be formed of other III-V group compound semiconductor that enables laser oscillation (lasing). The lower clad layer 54 may be an n-GaN/AlGaN layer having a predetermined refractive index, but may be formed of other compound semiconductor that enables lasing.

The resonance layer 57 may include a lower waveguide layer 53, an active layer 56, and an upper waveguide layer 55, which are sequentially stacked on the lower clad layer 54. The upper and lower waveguide layers 55 and 53 may be formed of a material having a lower refractive index than that of the active layer 56, preferably, a GaN-based III-V group compound semiconductor. The lower waveguide layer 53 may be an n-GaN layer, while the upper waveguide layer may be a p-GaN layer. The active layer 56 may be formed of any material that enables lasing, preferably, a material that can oscillate laser beams having a small threshold current and a stable transverse mode characteristic. That is, the active layer 56 may be formed of a GaN-based III-V group nitride compound semiconductor, such as $In_xAl_yGa_{1-x-y}N$ ($0 \leq x \leq 1$, $0 \leq y \leq 1$, and $x+y \leq 1$) containing a predetermined percent by weight of Al. The active layer 56 can have any one structure of multiple quantum well (MQW) and single quantum well (SQW), and the structure of the active layer 56 does not limit the technical scope of the present invention.

The upper clad layer 58 may be stacked on the upper waveguide layer 55 and has the protruding portion 58 in the center, and the refractive index of the upper clad layer 58 may be lower than that of the upper waveguide layer 55. Also, the upper contact layer 60 as an ohmic contact layer may be formed on the protruding portion 58a, and the upper electrode layer 62 may be formed thereon. The protruding portion 58a of the upper clad layer 58, the upper contact layer 60, and the upper electrode layer 62 form the ridge portion 66.

If the lower clad layer 54 is an n-type compound semiconductor layer, the upper clad layer 58 may be formed of a p-type compound semiconductor. If the lower clad layer 54 is a p-type compound semiconductor layer, the upper clad layer 58 may be formed of an n-type compound semiconductor. That is, if the lower clad layer 54 is an n-GaN/AlGaN layer, the upper clad layer 58 may be formed of p-GaN/AlGaN. Similarly, if the buffer layer 52 is an n-type compound semiconductor layer, the upper contact layer 60 may be formed of a p-type compound semiconductor, and the contrary case is also possible. Accordingly, if the buffer layer 52 is formed of n-GaN, the upper contact layer 60 may be formed of p-GaN.

The semiconductor laser diode of the present embodiment includes a buried layer 64 as a passivation layer, which may be formed on both upper corners of the upper clad layer 58 and the lateral surfaces and lower etched portions of the ridge portion 66. The buried layer 64 may be formed of an insulating material, such as $TiO_2$.

In a ridge waveguide structure where the buried layer 64 is formed, the upper p-type electrode layer 62 formed over the protruding portion 58 contacts the upper contact layer 60, and both lateral portions of the upper p-type electrode layer 62 may be covered by the buried layer 64.

The n-type electrode 51 may be formed in the stepped portion of the buffer layer 52 as the lower ohmic contact layer. However, the n-type electrode 51 may be formed on the bottom surface of the substrate 50 opposite the p-type electrode 62. In this case, the substrate 50 may be an SiC substrate or a GaN substrate.

FIGS. 3A through 3G are cross-sectional views illustrating a method of manufacturing a laser diode according to the present invention. In the following description, an etch process for exposing the buffer layer 52, i.e., the n-type contact layer, and a process of forming the n-type electrode 51 thereon will be omitted. A process of forming the stepped portion in the n-type contact layer may be performed using various methods before formation of a ridge portion, after formation of the ridge portion, during another etching process, or after formation of an upper p-type electrode.

Figure 3A:
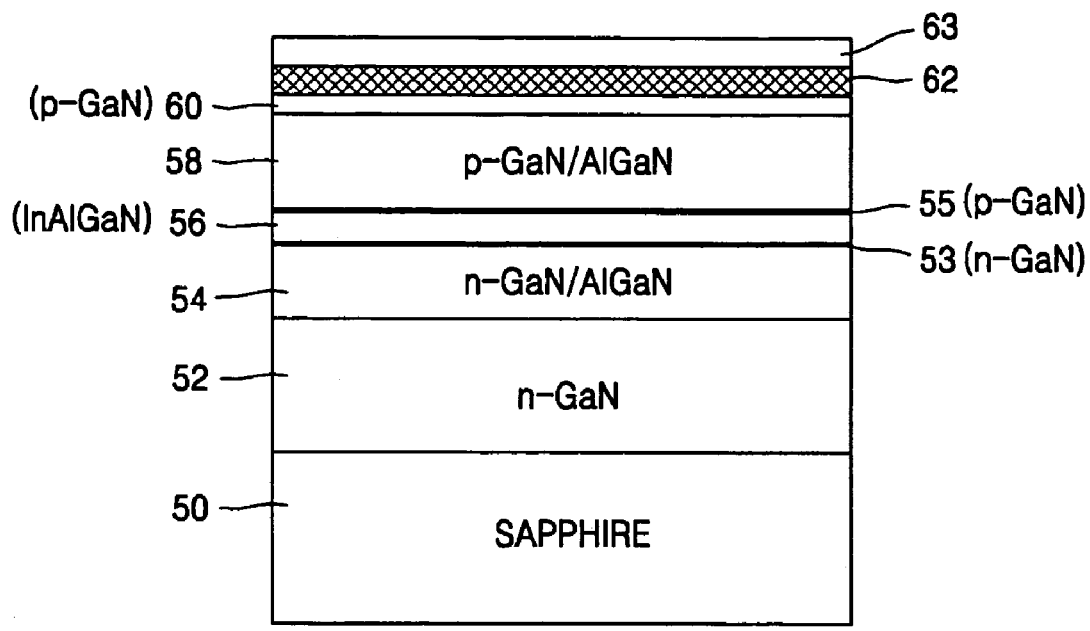
FIGS. 3A through 3G are cross-sectional views illustrating a method of fabricating a laser diode according to the present invention.

Referring to FIG. 3A, a buffer layer 52, a lower clad layer 54, a lower waveguide layer 53, an active layer 56, an upper waveguide layer 55, an upper clad layer 58, an upper contact layer 60, an upper electrode layer 62, and a sacrificial layer 63 are sequentially formed on a substrate 50.

A metal for the p-type upper electrode layer 62 may be deposited on the upper contact layer 60, and the sacrificial layer 63 may be formed on the p-type upper electrode layer 62. Here, the sacrificial layer 63 may be formed of $SiO_2$ to a thickness of about 100 to about 10000 Å, preferably, about 500 to about 2500 Å. The $SiO_2$ sacrificial layer 63 may be formed using chemical vapor deposition (CVD), plasma-enhanced CVD (PECVD), physical vapor deposition (PVD), or sputtering.

Figure 3B:
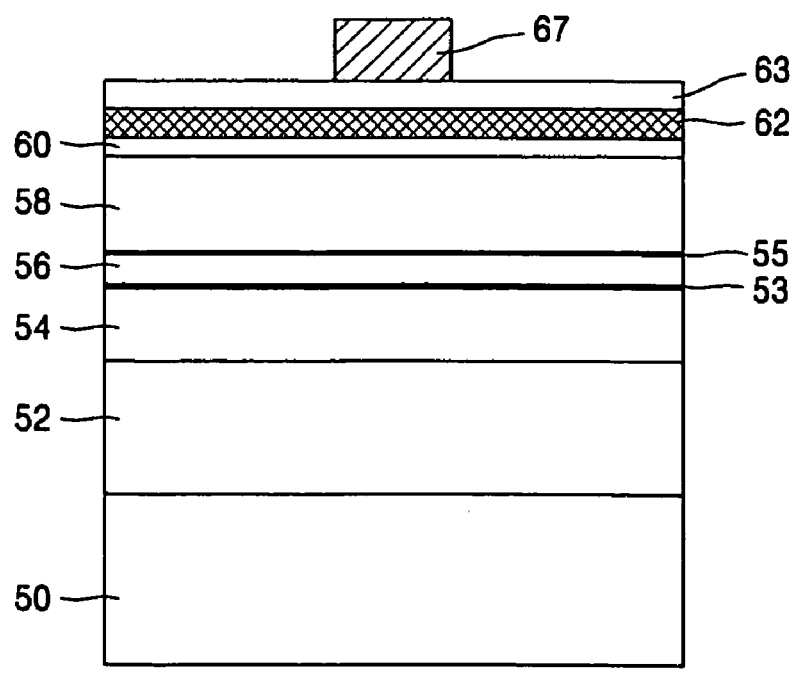

Referring to FIG. 3B, on top of the uppermost surface of the stacked structure, i.e., the sacrificial layer 63, a photoresist layer may be coated and then patterned (or a $SiO_2$ layer is deposited and then patterned), thereby forming a mask layer 67 for forming a ridge waveguide structure.

Figure 3C:
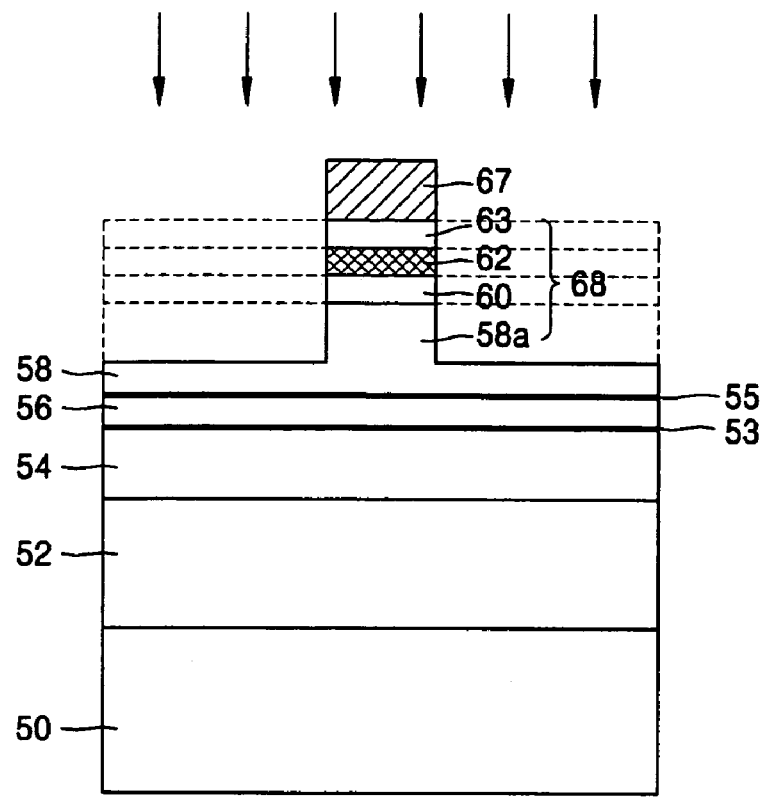

Referring to FIG. 3C, a portion of the sacrificial layer 63, which is not covered by the mask layer 67, may be vertically etched using reactive ion etching (RIE) (or ICP-RIE), reactive ion beam etching (RIBE), or chemically assisted ion beam etching (CAIBE), such that the upper clad layer 58 may be etched to a predetermined depth. Thus, a ridge portion 68 may be formed in the center of the upper clad layer 58. Accordingly, the ridge portion 68 includes the protruding portion 58a of the upper clad layer 58, the upper contact layer 60, the upper electrode layer 62, and the sacrificial layer 63. The ridge portion 68 has a stripe shape. After the foregoing etching process is finished, the mask 67 may be removed by an organic cleaning process using trichloroethylene (TCE)/acetone/isopropyl alcohol (IPA).

Figure 3D:
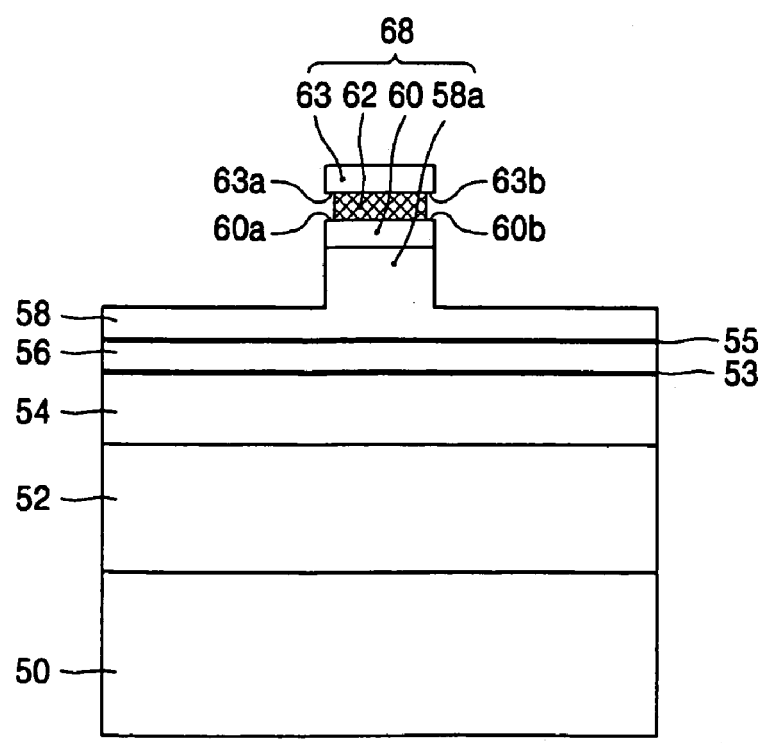

Referring to FIG. 3D, a portion of the upper electrode layer 62, which may be exposed by the lateral surface of the ridge portion 68, may be etched to a predetermined depth such that both top surfaces 60a and 60b of the upper contact layer 60 and both bottom surfaces 63a and 63b of the sacrificial layer 63 are exposed. In the present embodiment, the upper electrode layer 62 may be wet etched using a mixture of $H_2SO_4$ and $H_2O_2$ in the ratio of 10:1 for 15 seconds. More preferably, the ratio of the mixture and the time taken for wet etching may be controlled such that an amount of etching performed at an interface between the upper sacrificial layer 63 and the upper electrode layer 62 is greater than an amount of etching performed at an interface between the upper electrode layer 62 and the upper contact layer 60. In this case, the both bottom surfaces 63a and 63b of the sacrificial layer 63 may be exposed more than the both top surfaces 60a and 60b of the upper contact layer 60. This is because an interfacial characteristic between the upper electrode layer 62 and the sacrificial layer 63 formed of $SiO_2$ is poorer than that between the upper electrode layer 62 and the upper contact layer 60.

Figure 3E:
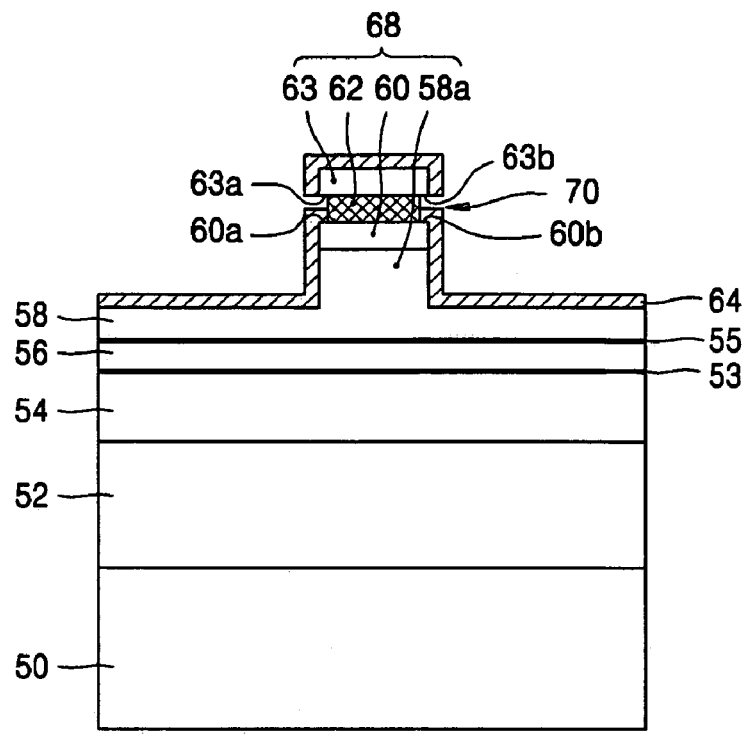

Referring to FIG. 3E, the buried layer 64 may be formed on the surface of the ridge portion 68 and the top surface of the upper clad layer 58 that extends from the ridge portion 68. The buried layer 64 ensures stabilization of a transverse mode characteristic and electrical insulation of the ridge portion 68. The buried layer 64 desirably includes an opening 70 such that at least partial bottom surfaces 63a and 63b of the sacrificial layer 63 are exposed. The opening 70 may be formed to correspond to the bottom surfaces 63a and 63b of the sacrificial layer 63 and the lateral surface of the upper electrode layer 62. When the upper electrode layer 62 is etched to the predetermined depth as described with reference to FIG. 3D, the width of the upper electrode layer 62 may be reduced. Thus, since both lateral surfaces of the upper electrode layer 62 may be covered by the sacrificial layer 63, it may be difficult to form the buried layer 64 on the lateral surfaces of the upper electrode layer 62. As a result, the buried layer 64 may have the opening 70.

The buried layer 64 may be formed of an insulating material, such as $TiO_2$, to a thickness of about 100 to about 10000 Å, preferably, about 500 to about 2500 Å. The $TiO_2$ layer may be formed using CVD, PECVD, PVD, or sputtering.

Figure 3F:
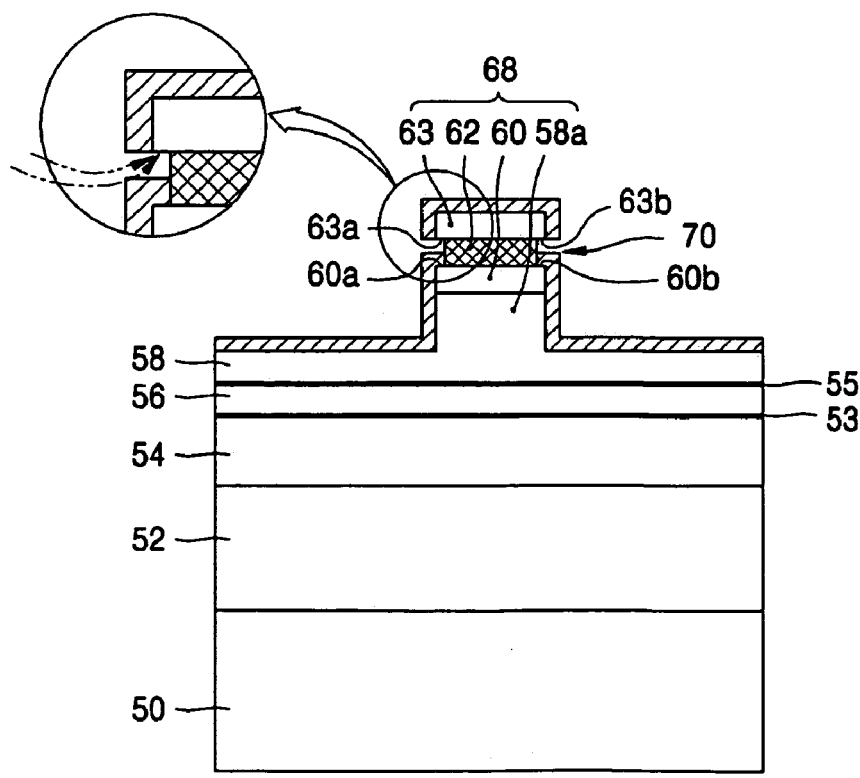

Referring to FIG. 3F, the sacrificial layer 63 and a portion of the buried layer 64 disposed thereon may be removed by supplying an etchant through the opening 70. Here, the sacrificial layer 63 and the portion of the buried layer 64 may be removed using liftoff. The sacrificial layer 63 may be wet etched using a BOE solution or an HF solution as the etchant. The sacrificial layer 63 may be selectively etched using the etchant supplied through at least one of the bottom surfaces 63a and 63b of the exposed sacrificial layer 63, and the portion of the buried layer 64 disposed on the sacrificial layer 63 may be removed together with the sacrificial layer 63. In the present embodiment, the sacrificial layer 63 may be etched using a BOE solution as the etchant for 30 seconds to several minutes and removed, and the buried layer 64, i.e., the TiO$_2$ layer may also be removed together with the sacrificial layer 63.

Figure 3G:
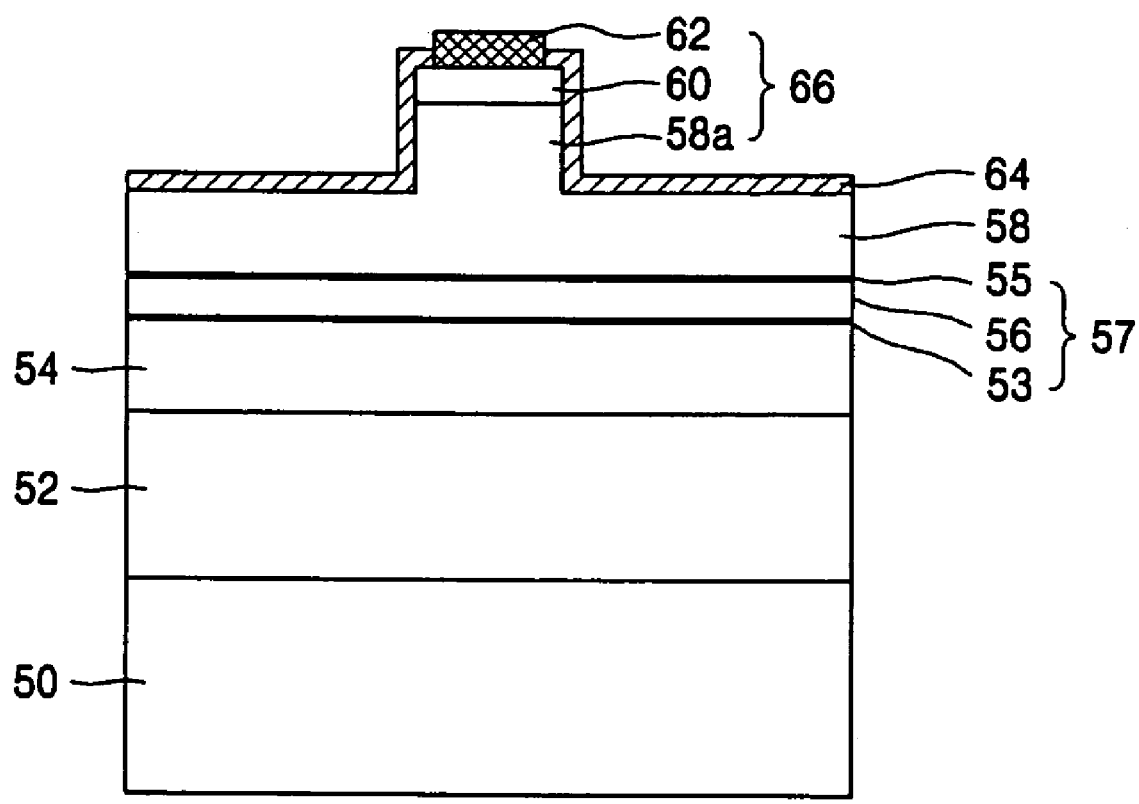

Referring to FIG. 3G, in the laser diode fabricated according to the method of the present invention, the buried layer 64 may be stably formed in a self-aligned manner on the both lateral surfaces of the ridge portion 66 including the both lateral surfaces of the upper electrode layer 62 and on the top surface of the upper clad layer 58 that extends from the ridge portion 66. Accordingly, leakage currents caused through the lateral surfaces of the ridge portion 66 may be controlled. Also, a contact area between the upper contact layer 60 and a p-type upper electrode can be increased so that heat generated in the laser diode during driving can be effectively emitted.

Figure 4:
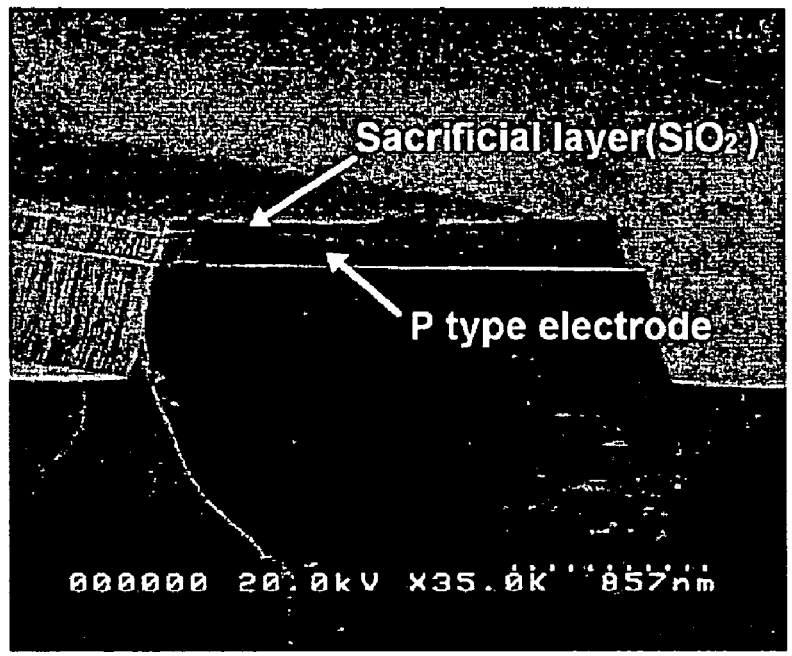
FIG. 4 is an SEM photograph of a section of a ridge portion obtained by etching an upper electrode layer to a predetermined depth.

FIG. 4 is an SEM photograph of a section of a ridge portion obtained by etching an upper electrode layer to a predetermined depth.

Figure 5:
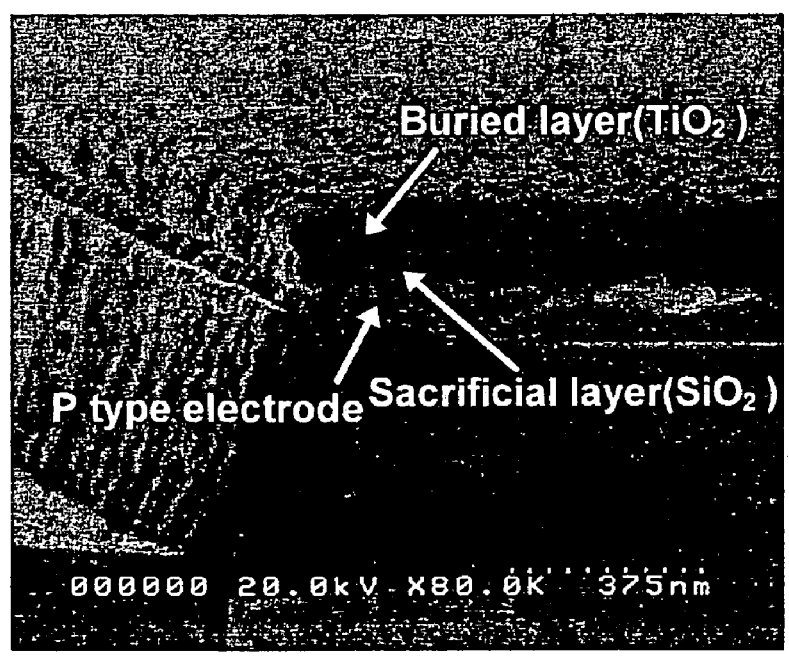
FIG. 5 is an SEM photograph of a section of a ridge portion obtained by forming a buried layer on the surface of the ridge portion.

FIG. 5 is an SEM photograph of a section of a ridge portion obtained by forming a buried layer on the surface of the ridge portion.

Figure 6:
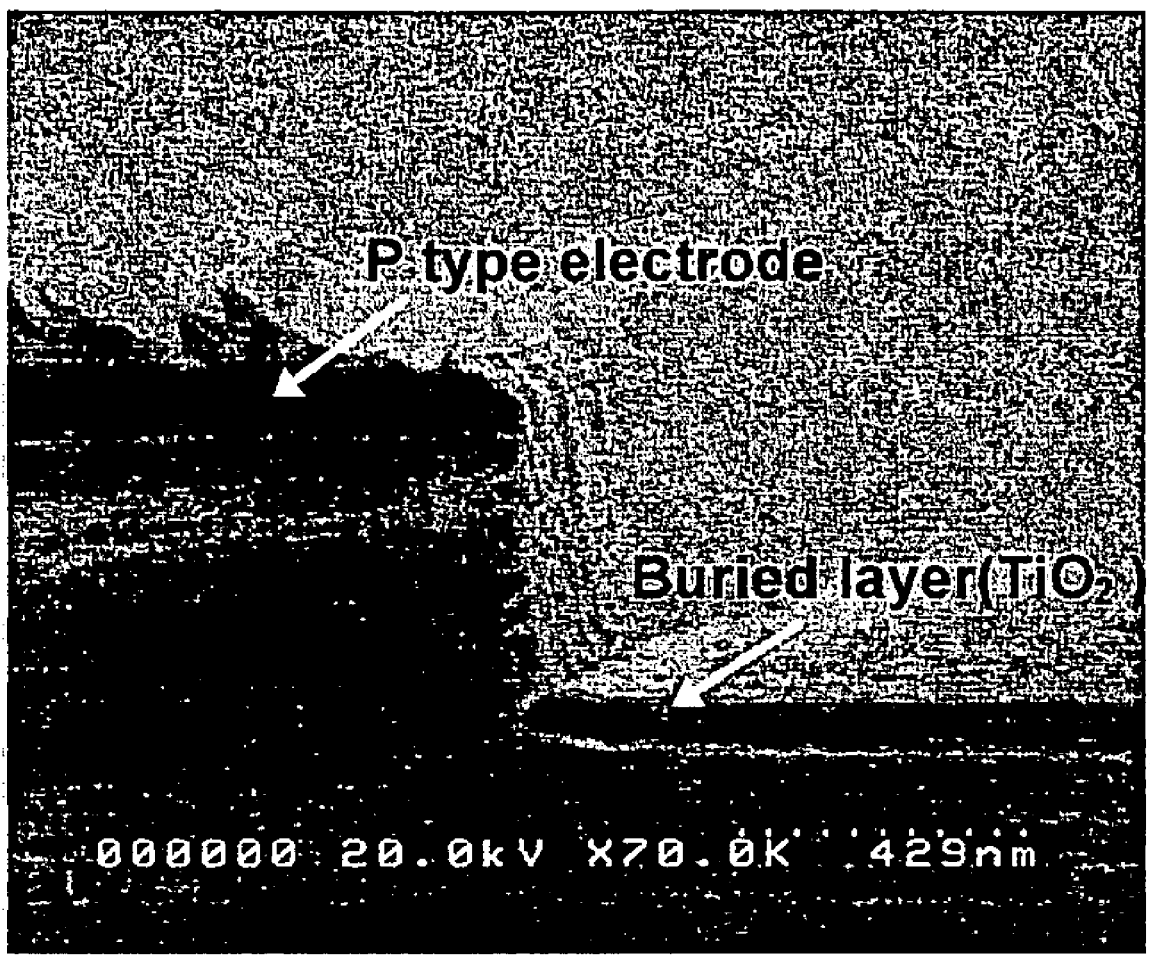
FIG. 6 is an SEM photograph of a section of a ridge portion obtained by removing a sacrificial layer and a buried layer disposed thereon.

FIG. 6 is an SEM photograph of a section of a ridge portion obtained by removing a sacrificial layer and a buried layer disposed thereon, which shows a portion of a laser diode fabricated according to the method of the present invention. Referring to FIG. 6, the surface roughness of a p-type upper electrode was improved, and the buried layer was stably formed.

According to an embodiment of the present invention, a ridge portion including an upper clad layer, an upper contact layer, an upper electrode layer, and a sacrificial layer may be formed using a one-time etching process, and a buried layer may be formed on the surface of the ridge portion using a one-time deposition process. Also, since the sacrificial layer and the buried layer disposed thereon may be easily removed from the ridge portion, the fabrication process is simple, and the precision and reliability thereof are enhanced.

As a result, the thickness of the buried layer can be sufficiently increased, and a wider range of materials can be used to form the buried layer than in conventional methods.

In addition, by using the exposed both top surfaces of the upper contact layer, the buried layer may be stably formed by self-alignment on the lateral surfaces of the ridge portion including the upper electrode layer, the upper contact layer, and the upper clad layer. Thus, leakage currents caused through the lateral surfaces of the ridge portion can be effectively controlled.

Further, a contact area between the upper contact layer and a p-type upper electrode can be increased so that heat generated in the laser diode during driving can be effectively emitted.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a laser diode, the method comprising:
sequentially forming at least a lower clad layer, a resonance layer, an upper clad layer, an upper contact layer, an upper electrode layer, and a sacrificial layer on a substrate;
forming a ridge portion by etching the sacrificial layer, the upper electrode layer, the upper contact layer, and a predetermined depth of the upper clad layer;
laterally etching portions of the upper electrode layer exposed at both sides of the ridge portion to thereby expose portions of the top surface of the upper contact layer and the bottom surface of the sacrificial layer at both sides of the ridge portion;
forming a buried layer having an opening that exposes at least a portion of the bottom surface of the sacrificial layer, the buried layer formed on the surface of the ridge portion and the top surface of the upper clad layer that extends from the ridge portion; and
removing the sacrificial layer and a portion of the buried layer disposed thereon by supplying an etchant through the opening, wherein the sacrificial layer is selectively etched using an etchant supplied through at least one of the bottom surfaces of the exposed sacrificial layer.

2. The method of claim 1, wherein the etching of the exposed upper electrode layer is performed by wet etching using a mixture of H$_2$SO$_4$ and H$_2$O$_2$.

3. The method of claim 1, wherein the removing of the sacrificial layer and the portion of the buried layer formed thereon is performed using liftoff.

4. The method of claim 3, wherein the removing of the sacrificial layer is performed using wet etching.

5. The method of claim 1, wherein the etchant is a buffered oxide etchant solution or an HF solution.

6. The method of claim 1, wherein the opening is formed to correspond to the bottom surfaces of the sacrificial layer and the lateral surfaces of the upper electrode layer.

7. The method of claim 1, wherein the sacrificial layer is formed of silicon oxide.

8. The method of claim 7, wherein the silicon oxide is SiO$_2$, and the sacrificial layer is formed to a thickness of about 100 to about 10000 Å.

9. The method of claim 1, wherein the buried layer is formed of TiO$_2$ to a thickness of about 100 to about 10000 Å.

10. The method of claim 1, wherein the etched upper electrode layer remains as an upper electrode of the laser diode.

11. The method of claim 1, wherein an amount of exposed portions of the bottom surface of the sacrificial layer is greater than an amount of exposed portions of the top surface of the upper contact layer in the step of laterally etching the portions of the electrode layer.

12. The method of claim 1, wherein the upper contact layer is formed by depositing a p-GaN layer.

* * * * *